US009341937B2

(12) United States Patent
Lin et al.

(10) Patent No.: US 9,341,937 B2
(45) Date of Patent: May 17, 2016

(54) LITHOGRAPHY SYSTEM AND METHOD FOR PATTERNING PHOTORESIST LAYER ON EUV MASK

(71) Applicant: Taiwan Semiconductor Manufacturing Co., Ltd., Hsin-Chu (TW)

(72) Inventors: Yun-Yue Lin, Hsinchu (TW); Chia-Jen Chen, Jhudong Township, Hsinchu County (TW); Hsin-Chang Lee, Zhubei (TW); Anthony Yen, Hsinchu (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 209 days.

(21) Appl. No.: 14/261,809

(22) Filed: Apr. 25, 2014

(65) Prior Publication Data

US 2015/0309401 A1    Oct. 29, 2015

(51) Int. Cl.
*G03B 27/54* (2006.01)
*G03F 1/00* (2012.01)
*G03F 1/22* (2012.01)
*G03F 1/46* (2012.01)

(52) U.S. Cl.
CPC ...  *G03F 1/22* (2013.01); *G03F 1/46* (2013.01)

(58) Field of Classification Search
CPC ................ G03F 7/22; G03F 1/40; G03F 1/46
USPC .................................................. 430/5; 355/67
See application file for complete search history.

(56) References Cited

U.S. PATENT DOCUMENTS

2013/0075605 A1    3/2013   Krivts (Krayvitz) et al.

*Primary Examiner* — Peter B Kim
(74) *Attorney, Agent, or Firm* — McClure, Qualey & Rodack, LLP

(57) ABSTRACT

A lithography system for an extreme ultra violet (EUV) mask is provided. The lithography system includes a coupling module. The coupling module includes at least one mask contact element configured to touch a peripheral area of the EUV mask. The lithography system also includes an ammeter having an end electrically connected to the EUV mask through the at least one mask contact element and another end connected to a ground potential. The ammeter includes a sensor configured to measure a current conducting from the EUV mask to the ground potential and a compensation circuit configured to provide a compensation current that is opposite to the current measured by the sensor.

20 Claims, 6 Drawing Sheets

LITHOGRAPHY SYSTEM AND METHOD FOR PATTERNING PHOTORESIST LAYER ON EUV MASK

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component or line than can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

In the manufacture of integrated circuits (IC), or chips, patterns representing different layers of the chip are created on a series of reusable photomasks (also referred to herein as masks) in order to transfer the design of each chip layer onto a semiconductor substrate during the manufacturing process. These layers are built up using a sequence of processes and translate into the tiny transistors and electrical circuits that comprise each completed chip. Thus, any defects in the mask may be transferred to the chip, potentially adversely effecting performance. Defects that are severe enough may render the mask completely useless. A reflective mask is used during extreme ultra-violet (EUV) lithography. To provide a higher resolution benefited by the EUV lithography, a high quality of the reflective mask with low defects is eagerly needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
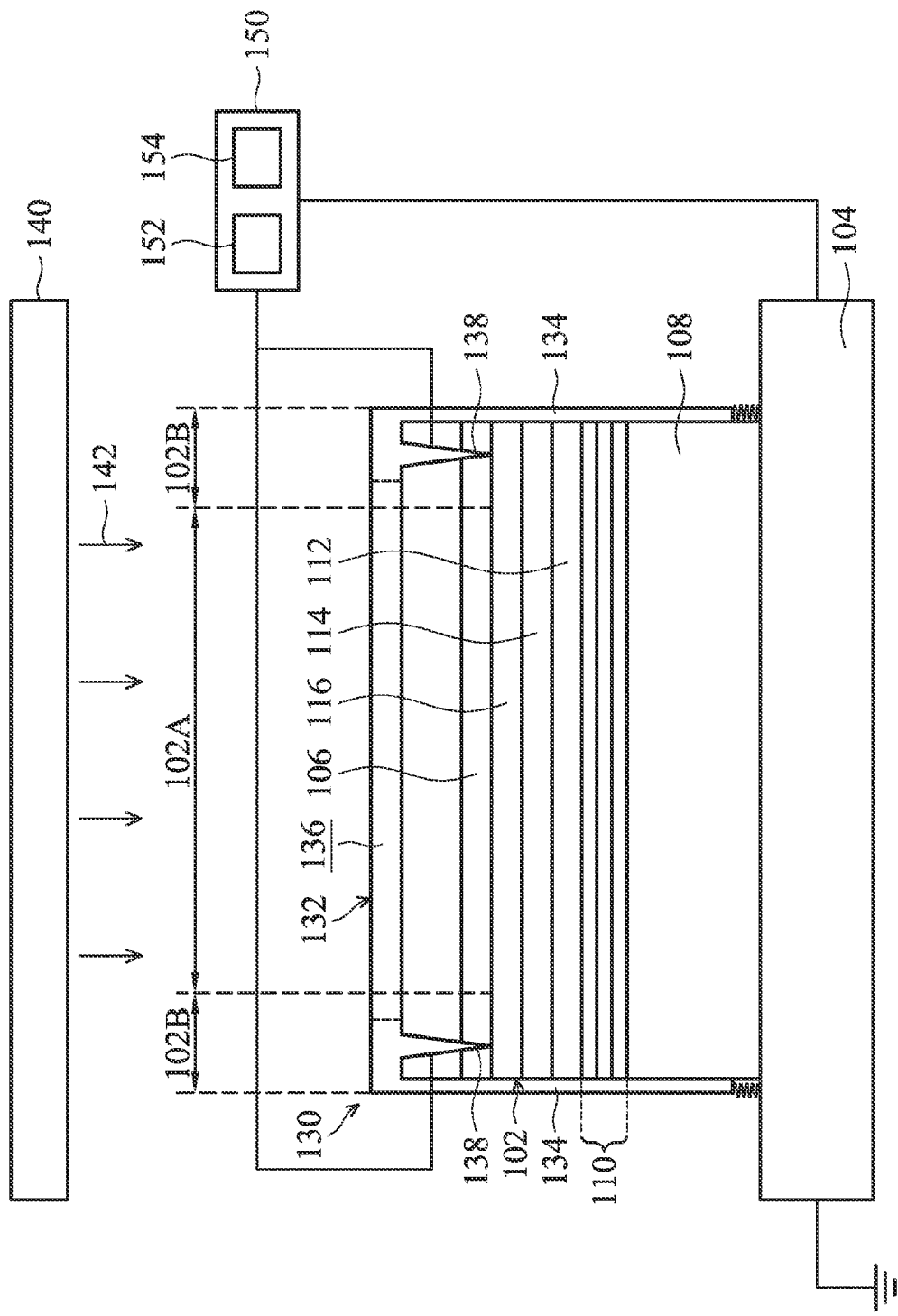
FIG. 1 shows a cross-sectional view of a lithography system for pattering a photoresist layer on an EUV mask, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a cross-sectional view of a lithography system for pattering a photoresist layer on an EUV mask, in accordance with some embodiments. Referring to FIG. 1, an EUV mask 102, which is ready to be patterned, is positioned in a lithography system 100. In some embodiments, the EUV mask 102 is a blank EUV mask. The EUV mask 102 is positioned over a stage 104. The stage 104 may be grounded. In some embodiments, the EUV mask 102 includes a pattern-forming area 102A in the middle area of the EUV mask 102 and a peripheral area 102B surrounding the pattern-forming area 102A. A photoresist layer 106 is deposited on the EUV mask 102. In some embodiments, the photoresist layer 106 is deposited over the EUV mask 102 before placing the EUV mask 102 into the lithography system 100.

In some embodiments, the EUV mask 102 includes a substrate 108, a reflective multilayer (RML) structure 110, a capping layer 112, a buffer layer 114 and an anti-reflection layer 116. The substrate 108 is chosen to minimize image distortion due to mask heating by the intensified illumination radiation. In some embodiments, the substrate 108 includes a low thermal expansion material (LTEM). The LTEM includes fused quartz, silicon carbide, calcium fluoride, silicon oxide-titanium oxide alloy, black diamond and/or other suitable LTEMs. Alternatively, the substrate 108 includes other materials, such as quartz or glass, depending on design requirements of the EUV mask 102. The substrate 108 includes materials with a low defect level and a smooth surface.

The reflective multilayer (RML) structure 110 is formed over the substrate 108. The RML structure 110 is designed to reflect of the radiation light, such as the extreme ultra violet light (EUV). In some embodiments, the RML structure 110 includes a number of alternating layers of materials having a high refractive index and low refractive index. Paring these two types of materials together provides a resonant reflectivity. In some embodiments, the RML structure 110 includes a plurality of film pairs, such as molybdenum-silicon (Mo/Si) film pairs (e.g., a layer of molybdenum above or below a layer of silicon in each film pair).

In some embodiments, the capping layer 112 is formed on the RML structure 110 to prevent oxidation of the RML structure 110 during a mask patterning process. The capping layer 112 may include ruthenium (Ru), Ru compounds such as RuB and RuSi, silicon dioxide ($SiO_2$), silicon nitride, aluminum oxide, amorphous carbon, boron carbide or other suitable materials. In some embodiments, the buffer layer 114 is formed over the capping layer 112 to act as an etch stop layer in the patterning process of the anti-reflection layer 116. The buffer layer includes ruthenium (Ru), ruthenium compounds such as RuB, RuSi, chromium (Cr), chromium oxide or chromium nitride. A low temperature deposition process is often chosen for the buffer layer 114 to prevent inter-diffusion of the RML structure 110.

In some embodiments, the anti-reflection layer (AR coating) 116 is formed over the buffer layer 114. The anti-reflection layer 116 may include a single layer or multiple layers formed of chromium (Cr), chromium oxide (CrO), titanium nitride (TiN), tantalum nitride (TaN), tantalum (Ta), titanium (Ti), molybdenum (Mo), aluminum-copper (Al—Cu), palladium (Pd), tantalum boron nitride (TaBN), aluminum oxide (AlO), silver oxide (AgO) and/or a combination thereof. In some embodiments, the anti-reflection layer 116 absorbs radiation, such as the EUV with a 13.5 nm wavelength, projected onto the EUV mask 102.

One or more of the layers may be formed by various methods, including physical vapor deposition process such as evaporation and DC magnetron sputtering, a plating process such electroless plating or electroplating, a chemical vapor deposition process such as atmospheric pressure CVD (APCVD), low-pressure CVD (LPCVD), plasma enhanced CVD (PECVD) or high-density plasma CVD (HDPCVD), ion beam deposition, spin-on coating, metal organic decomposition (MOD) and/or other suitable methods.

In some embodiments, a coupling module 130 is disposed on the stage 104. The coupling module 130 includes an upper portion 132 and a lower portion 134. In some embodiments, an aperture 136 is formed at the upper portion 132 of the coupling module 130 for exposing the pattern-forming area 102A of the EUV mask 102. In some embodiments, the upper portion 132 of the coupling module 130 includes one or more mask contact elements 138. In some embodiments, the mask contact element 138 includes a pin structure or a pillar structure and is formed of a conductive material. In some embodiments, the mask contact element 138 is positioned to a surface of the EUV mask 102 in the peripheral area of the EUV mask 102. For example, the mask contact element 138 is positioned to contact the anti-reflection layer 116 in the peripheral area of the EUV mask 102. In some embodiments, the mask contact element 138 penetrates through the photoresist layer 104 to touch and electrically connect the anti-reflection layer 116. The mask contact element 138 is configured to conduct charges on the EUV mask 102, preventing the charges from accumulating. The lower portion 134 of the coupling module 130 may surround the EUV mask 102. The lower portion 134 also provides a suitable height for the upper portion 132 such that the mask contact element 138 is able to touch an upper surface of the anti-reflection layer 116 but not penetrate into the anti-reflection layer 116.

In some embodiments, a radiation source 140 is positioned over the EUV mask. The radiation source 140 illuminates radiation 142 passing through the aperture 136 of the coupling module 130 for patterning the photoresist layer 106. The radiation 142 may include electron beam (e-beam) or ion beam. In some embodiments, in a lithography process, the photoresist layer 106 is patterned by direct writing of the radiation 142.

An ammeter 150 is electrically connected to the mask contact element 138. In some embodiments, the ammeter 150 has one end connected to the mask contact element 138 and another end connected to a ground potential. For example, the ammeter 150 is electrically connected to the stage 106 for grounding. The ammeter 150 includes a sensor 152 to sense the charges on the EUV mask 102, by measuring a current flowing from the EUV mask 102 to the ground potential.

It is found that a lithography process, such as e-beam writing, may induce backward scattering electrons (BSEs). In addition, during the lithography process, the charges would accumulate on the EUV mask, in amounts that are relative to the pattern density of the EUV mask 102, resulting in non-uniform surface charging and local heating. In some embodiments, the above issues are improved by etching specific trenches in the anti-reflection layer 116 before performing the lithography process. However, an additional etching step is needed, and the BSE issue is only moderately improved since the BSEs are difficult to predict.

In some embodiments, the ammeter 150 also includes a compensation circuit 154. The compensation circuit 154 provides a compensation current for balancing the BSEs and the non-uniform charging on the EUV mask 102. In some embodiments, the compensation current is opposite (e.g., the same magnitude but opposite direction) to the current measured by the ammeter 150 (e.g., by sensor 152). In some embodiments, the compensation current is provided in real time with respect to the current measured by the ammeter 150. In these embodiments, the additional etching process is omitted. The anti-reflection layer 116 of the EUV mask 102 has a substantially flat upper surface during the lithography process of the photoresist layer 106.

Figure 2:
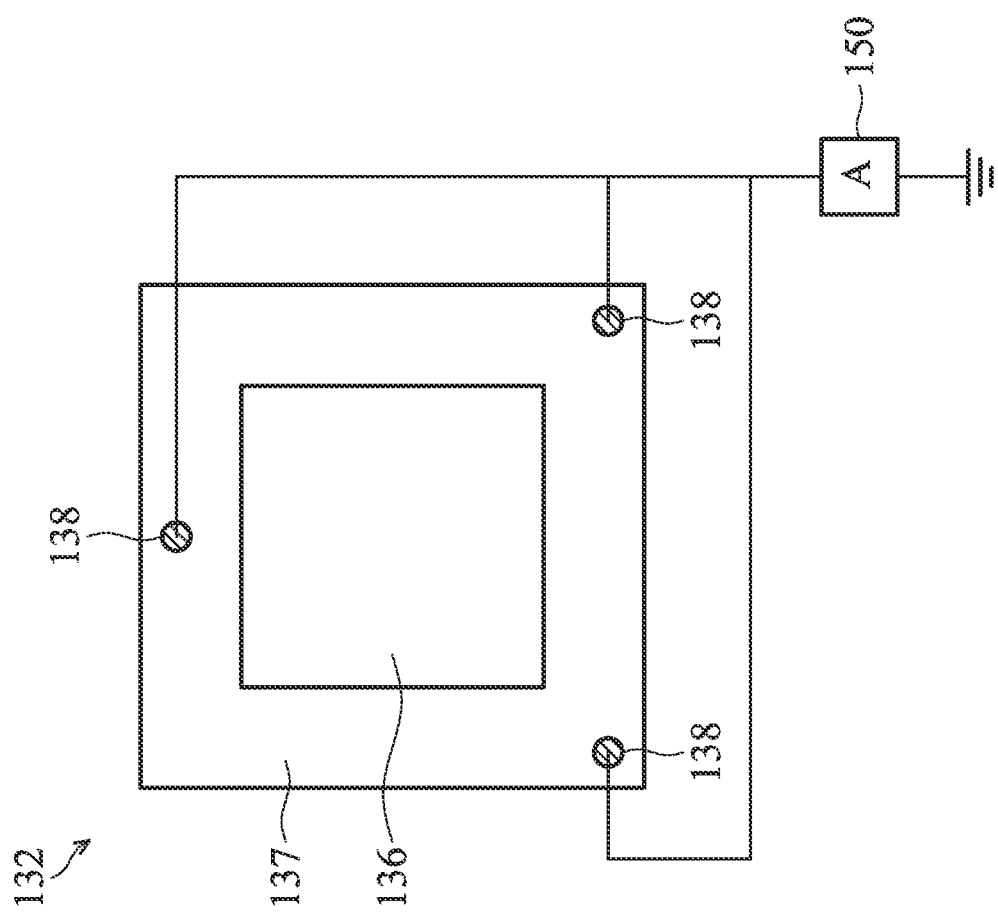
FIG. 2 shows an illustrative scheme of an upper portion of a coupling module, in accordance with some embodiments.

FIG. 2 shows an illustrative scheme of an upper portion of a coupling module, in accordance with some embodiments. The upper portion 132 of the coupling module 130 includes an aperture 136 in the middle area and a frame 137 surrounding the aperture 136. The aperture 136 allows radiation 140 to reach the pattern-forming area 102A of the EUV mask 102. The aperture 136 may include a square shape, a rectangular shape, a circular shape or another suitable shape. One or more of the mask contact elements 138 are formed on the frame 137. The mask contact element 138 will align to the peripheral area 102B of the EUV mask 102 during the lithography process. The one or more of mask contact elements 138 may be arranged in any suitable shape. For example, as shown in FIG. 2, three mask contact elements 138 are arranged in a triangular shape, although other shapes are also applicable. Each of the mask contact elements 138 is electrically connected to the ammeter 150 through wires, and a total current conducted from each of the mask contact elements 138 is measured by the ammeter 150. In some embodiments, the ammeter 150 provides a compensation current to the EUV mask through the mask contact elements 138. The charges (e.g., the BSEs or the charges trapped by the patterns) on the EUV mask 102 and around the mask contact elements 138 may be balanced. Since the compensation current is provided corresponding to the current measured by the ammeter 150 in real time, the charge balance on the EUV mask 102 is a dynamic balance, which may be adjusted at any time during the lithography process.

Figure 3A:
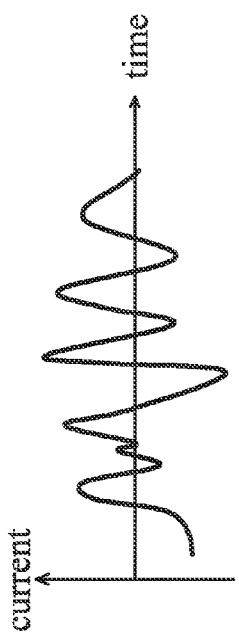
FIG. 3A illustrates a current measured by an ammeter versus time during e-beam mask writing, in accordance with some embodiments.

FIG. 3A illustrates a current versus time during e-beam mask writing, in accordance with some embodiments. As shown in FIG. 3A, during the e-beam mask writing, the current measured by the ammeter 150 shows that the charge accumulations and/or distributions on the EUV mask 102 are unstable and vary with time.

Figure 3B:
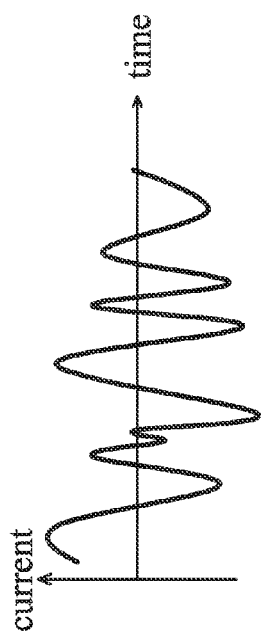
FIG. 3B illustrates a compensation current corresponding to the measured current of FIG. 3A versus time, in according with some embodiments.
Figure 3C:
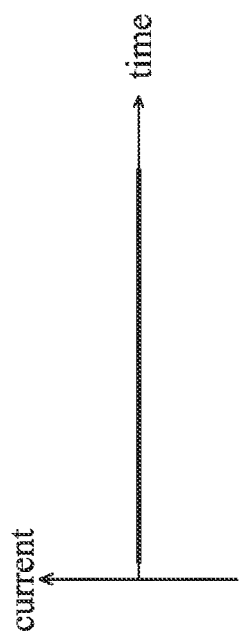
FIG. 3C illustrates a current measured by an ammeter after a compensation current is provided, versus time, in according with some embodiments.
Figure 4B:
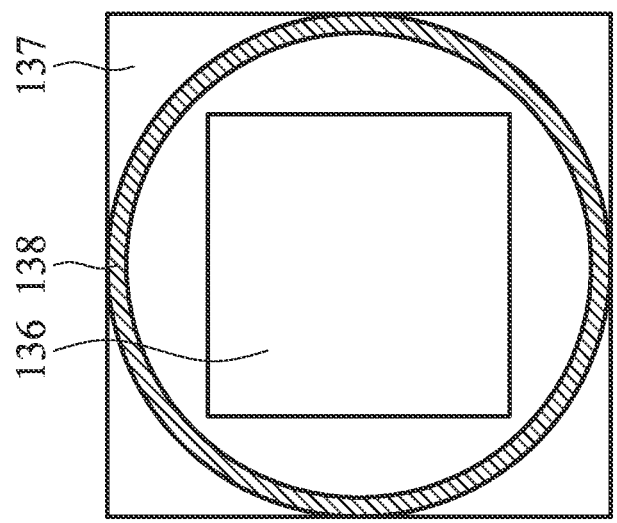
FIGS. 4A to 4D show various arrangements and shapes of mask contact elements on a coupling module, in accordance with some embodiments.
Figure 4A:
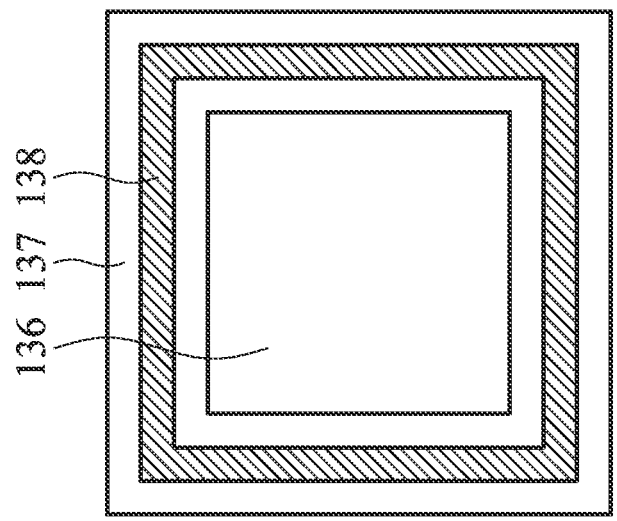
Figure 4D:
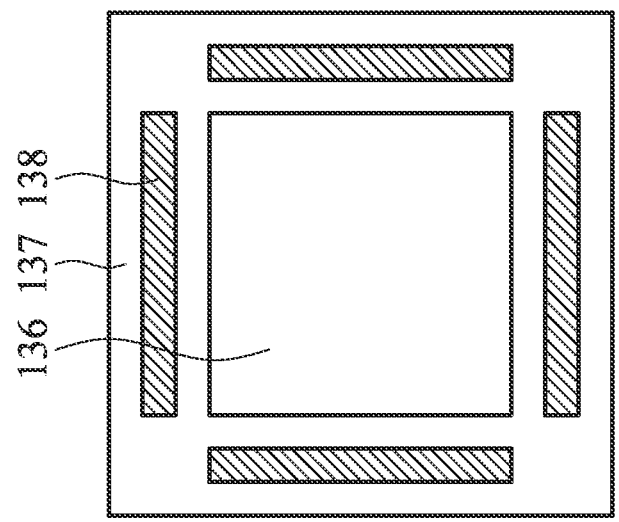
Figure 4C:
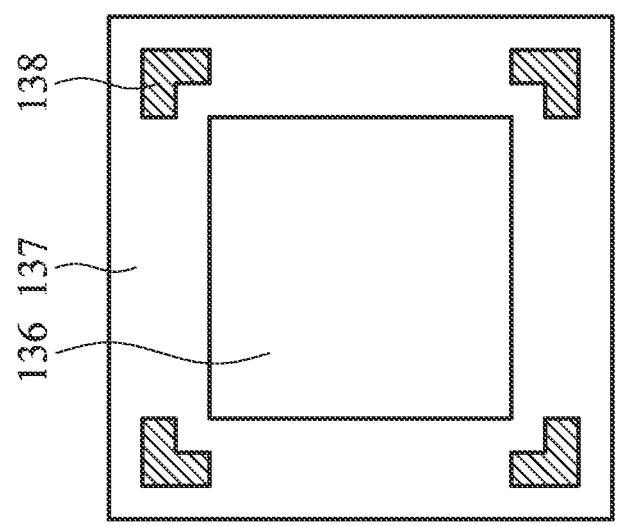

To balance the charges on the EUV mask 102, a compensation current corresponding to the current of FIG. 3A is provided. The compensation current is opposite to the current measured by the ammeter 152. For example, a current shown in FIG. 3B is provided while the current of FIG. 3A is measured. The compensation current has the same magnitude and opposite direction with respect to the measured current. Referring to FIG. 3C, by providing the compensation current, charge balance can be achieved, and substantially no current fluctuation is measured by the ammeter 152.

FIGS. 4A to 4D show various arrangements and shapes of mask contact elements on a coupling module, in accordance with some embodiments. In some embodiments, in addition to the three pins as shown in FIG. 2, the mask contact element 138 also includes a ring shape such as a square ring, a circle ring, an oval ring or a rectangular ring, surrounding the aperture 134. In some embodiments, the mask contact elements 138 have a stripe shape or in an L-shape, arranged in the corners or edges of the frame 137 of the coupling module 130, and surround the aperture 134.

Figure 5:
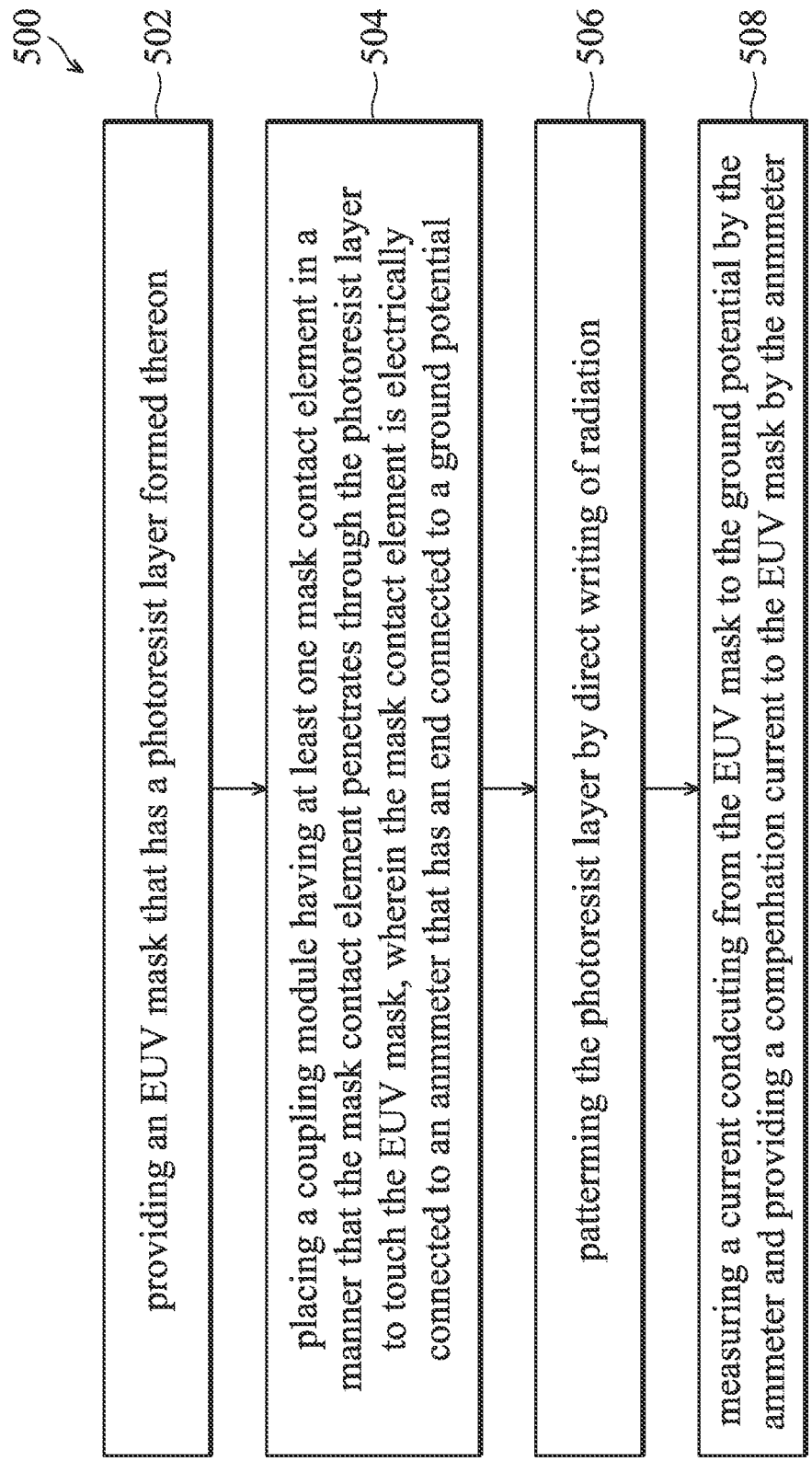
FIG. 5 is a flow chart of a method of lithographing a photoresist layer on an EUV mask, in accordance with some embodiments.

FIG. 5 is a flow chart of a method of lithographing a photoresist layer on an EUV mask, in accordance with some embodiments. The method 500 starts at operation 502, in which an EUV mask that has a photoresist layer thereon is placed onto a stage. In some embodiments, the EUV mask is formed by: providing a low thermal expansion material (LTEM) substrate; forming a reflective multilayer structure over the LTEM substrate; and forming an anti-reflection layer over the reflective multilayer structure. In some embodiments, the photoresist layer is deposited on the anti-reflection layer.

The method continues to operation 504, in which a coupling module having one or more mask contact elements is placed in a manner that the mask contact element penetrates through the photoresist layer to touch the EUV mask. The mask contact element is electrically connected to an ammeter that has an end connected to a ground potential.

The method continues to operation 506, in which the photoresist layer is patterned by direct writing of radiation.

The method continues to operation 508, in which a current conducting from the EUV mask to the ground potential is measured by the ammeter while a compensation current opposite to the current is provided to the EUV mask by the ammeter. In some embodiments, the current is measured by a sensor of the ammeter, and the compensation current is provided by a compensation circuit of the ammeter.

Embodiments of the present disclosure provide a lithography system and a method of lithography for a photoresist layer on an EUV mask, which can dynamically balancing surface charges on the EUV mask and improve resolution of the lithography. An ammeter is used to measure the charges on the EUV mask and provide a compensation current that is opposite to the measured current in real time. Accordingly, the BSEs and the non-uniform surface charging are successfully improved, and no additional etching process for etching the anti-reflection layer before patterning the photoresist layer is needed.

A lithography system for an extreme ultra violet (EUV) mask is provided. The lithography system includes a coupling module. The coupling module includes at least one mask contact element configured to touch a peripheral area of the EUV mask. The lithography system also includes an ammeter having an end electrically connected to the EUV mask through the at least one mask contact element and another end connected to a ground potential. The ammeter includes a sensor configured to measure a current conducting from the EUV mask to the ground potential and a compensation circuit configured to provide a compensation current that is opposite to the current measured by the sensor.

A method of lithographing a photoresist layer on an EUV mask is provided. The method includes placing an EUV mask that has a photoresist layer thereon onto a stage. The method also includes placing a coupling module having at least one contact element in manner that allows the at least one mask contact element penetrating through the photoresist layer to touch the EUV mask. The at least one contact element is electrically connected to an ammeter that has an end connected to a ground potential. The method further includes patterning the photoresist layer by direct writing of a radiation. In addition, the method includes measuring a current conducting from the EUV mask to the ground potential by the ammeter while providing a compensation current opposite to the current to the EUV mask by the ammeter.

A method of lithographing a photoresist layer on an EUV mask is provided. The method includes providing a low thermal expansion material (LTEM) substrate. The method also includes forming a reflective multilayer structure on the LTEM substrate. The method further includes forming an anti-reflection layer over the reflective multilayer structure. In addition, the method includes depositing a photoresist layer over the anti-reflection layer. The method includes placing a coupling module having at least one contact element in manner that allows the at least one mask contact element penetrating the photoresist layer to touch the anti-reflection layer. The at least one contact element is electrically connected to an ammeter that has an end connected to a ground potential. The method also includes patterning the photoresist layer by direct writing of a radiation. The method further includes measuring a current conducting from the anti-reflection layer to the ground potential by the ammeter while providing a compensation current opposite to the current to the anti-reflection layer by the ammeter.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography system for an extreme ultra violet (EUV) mask, comprising:
   a coupling module, comprising at least one mask contact element configured to touch a peripheral area of the EUV mask; and
   an ammeter having an end electrically connected to the EUV mask through the at least one mask contact element and another end connected to a ground potential, wherein the ammeter comprises a sensor configured to measure a current conducting from the EUV mask to the ground potential and a compensation circuit configured to provide a compensation current that is opposite to the current measured by the sensor.

2. The lithography system as claimed in claim 1, wherein the coupling module comprises an aperture that allows a radiation to reach a pattern-forming area of the EUV mask and a frame surrounding the aperture.

3. The lithography system as claimed in claim 2, wherein the at least one contact element is located on the frame and has a ring shape surrounding the aperture.

4. The lithography system as claimed in claim 2, wherein the at least one contact element comprises a plurality of pin, stripe or L-shaped structures that is located on corners or edges of the frame and surrounds the aperture.

5. The lithography system as claimed in claim 4, wherein each of the pin, stripe or L-shaped structures is electrically connected to the ammeter.

6. The lithography system as claimed in claim 1, further comprising a stage configured to support the EUV mask.

7. The lithography system as claimed in claim 6, wherein the stage is grounded.

8. The lithography system as claimed in claim 7, wherein the ammeter is connected to the ground potential via the stage.

9. The lithography system as claimed in claim 1, further comprising a radiation source configured to illuminate an e-beam or ion-beam.

10. A method of lithographing a photoresist layer on an EUV mask, comprising:
   placing an EUV mask that has a photoresist layer thereon onto a stage;
   placing a coupling module having at least one contact element in manner that allows the at least one mask contact element penetrating through the photoresist layer to touch the EUV mask, wherein the at least one contact element is electrically connected to an ammeter that has an end connected to a ground potential;
   patterning the photoresist layer by direct writing of a radiation; and
   measuring a current conducting from the EUV mask to the ground potential by the ammeter while providing a compensation current opposite to the current to the EUV mask by the ammeter.

11. The method as claimed in claim 10, wherein the compensation current is provided in real time corresponding to the current measured by the ammeter.

12. The method as claimed in claim 10, wherein the EUV mask has a substantially flat upper surface while the at least one mask contact element touches it.

13. The method as claimed in claim 10, wherein the radiation comprises e-beam or ion-beam.

14. The method as claimed in claim 10, wherein the compensation current has the same magnitude and opposite direction as compared to the current measured by the ammeter.

15. The method as claimed in claim 10, wherein charges on the EUV mask are balanced after the providing of the compensation current.

16. A method of lithographing a photoresist layer on an EUV mask, comprising:
   forming a reflective multilayer structure over a low thermal expansion material substrate;
   forming an anti-reflection layer over the reflective multilayer structure;
   depositing a photoresist layer over the anti-reflection layer;
   placing a coupling module having at least one contact element in manner that allows the at least one mask contact element penetrating through the photoresist layer to touch the anti-reflection layer, wherein the at least one contact element is electrically connected to an ammeter that has an end connected to a ground potential;
   patterning the photoresist layer by direct writing of a radiation; and
   measuring a current conducting from the anti-reflection layer to the ground potential by the ammeter while providing a compensation current opposite to the current to the anti-reflection layer by the ammeter.

17. The method as claimed in claim 16, wherein the anti-reflection layer has a flat upper surface when the at least one mask contact element touches it.

18. The method as claimed in claim 16, wherein the radiation comprises e-beam or ion-beam.

19. The method as claimed in claim 16, wherein the current conducting from the anti-reflection layer to the ammeter flows through the at least one mask contact element.

20. The method as claimed in claim 16, wherein the compensation current provided to the anti-reflection layer flows through the at least one mask contact element.

\* \* \* \* \*